(12) United States Patent
McMillin et al.

(10) Patent No.: US 6,508,913 B2
(45) Date of Patent: Jan. 21, 2003

(54) GAS DISTRIBUTION APPARATUS FOR SEMICONDUCTOR PROCESSING

(75) Inventors: Brian K. McMillin, Fremont, CA (US); Robert Knop, Fremont, CA (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 09/983,680

(22) Filed: Oct. 25, 2001

(65) Prior Publication Data

US 2002/0042205 A1 Apr. 11, 2002

Related U.S. Application Data

(62) Division of application No. 09/680,319, filed on Oct. 6, 2000, now Pat. No. 6,333,272.

(51) Int. Cl.[7] .............................. C23F 1/00; C23C 16/00
(52) U.S. Cl. ........................ 156/345.29; 156/345.26; 156/345.24; 118/715; 118/723 R
(58) Field of Search ................. 156/345.24, 345.26, 156/345.29; 118/715, 723 R

(56) References Cited

U.S. PATENT DOCUMENTS

| | | | |
|---|---|---|---|
| 4,369,031 A | 1/1983 | Goldman et al. | 432/198 |
| 4,949,670 A * | 8/1990 | Krogh | 118/692 |
| 5,013,398 A | 5/1991 | Long et al. | 156/643 |
| 5,134,965 A | 8/1992 | Tokuda et al. | 118/723 |
| 5,415,728 A | 5/1995 | Hasegawa et al. | 156/643.1 |
| 5,453,124 A * | 9/1995 | Moslehi et al. | 118/715 |
| 5,522,934 A | 6/1996 | Suzuki et al. | 118/723 AN |
| 5,614,055 A | 3/1997 | Fairbairn et al. | 156/345 |
| 5,702,530 A * | 12/1997 | Shan et al. | 118/723 ME |
| 5,736,457 A | 4/1998 | Zhao | 438/624 |
| 5,772,771 A | 6/1998 | Li et al. | 118/723 I |
| 5,911,834 A | 6/1999 | Fairbairn et al. | 134/1.3 |
| 5,916,369 A * | 6/1999 | Anderson et al. | 118/715 |
| 5,951,772 A * | 9/1999 | Matsuse et al. | 118/723 R |
| 5,997,950 A * | 12/1999 | Telford et al. | 427/255.392 |
| 6,013,155 A | 1/2000 | McMillin et al. | 156/345 |
| 6,042,687 A | 3/2000 | Singh et al. | 156/345 |
| 6,068,729 A | 5/2000 | Shrotriya | 156/345 |
| 6,083,569 A | 7/2000 | Gupta et al. | 156/345 |
| 6,125,859 A | 10/2000 | Kao et al. | 134/1.1 |
| 6,190,233 B1 | 2/2001 | Hong et al. | 451/2 |
| 6,217,937 B1 * | 4/2001 | Shealy | 118/712 |
| 6,294,026 B1 * | 9/2001 | Roithner et al. | 118/715 |
| 6,333,272 B1 * | 12/2001 | McMillin et al. | 438/710 |
| 2002/0042205 A1 * | 4/2002 | McMillin et al. | 438/710 |

FOREIGN PATENT DOCUMENTS

| | | |
|---|---|---|
| JP | 11067737 A | 3/1999 |
| JP | 2000306884 A | 11/2000 |

* cited by examiner

Primary Examiner—Jeffrie R. Lund
(74) Attorney, Agent, or Firm—Burns, Doane, Swecker & Mathis, LLP

(57) ABSTRACT

A gas distribution system for processing a semiconductor substrate includes a plurality of gas supplies, a mixing manifold wherein gas from the plurality of gas supplies is mixed together, a plurality of gas supply lines delivering the mixed gas to different zones in the chamber, and a control valve. The gas supply lines include a first gas supply line delivering the mixed gas to a first zone in the chamber and a second gas supply line delivering the mixed gas to a second zone in the chamber. The control valve controls a rate of flow of the mixed gas in the first and/or second gas supply line such that a desired ratio of flow rates of the mixed gas is achieved in the first and second gas supply lines.

11 Claims, 6 Drawing Sheets

GAS DISTRIBUTION APPARATUS FOR SEMICONDUCTOR PROCESSING

This application is a divisional of application Ser. No. 09/680,319, filed on Oct. 6, 2000, now U.S. Pat. No. 6,333,272.

FIELD OF THE INVENTION

The present invention relates to reaction chambers used for processing semiconductor substrates, such as integrated circuit wafers, and specifically to improvements in the gas distribution system used in these reaction chambers.

BACKGROUND OF THE INVENTION

Semiconductor processing includes deposition processes such as chemical vapor deposition (CVD) of metal, dielectric and semiconducting materials, etching of such layers, ashing of photoresist masking layers, etc. Such semiconductor processes are typically carried out in vacuum chambers wherein process gas is used to treat a substrate such as a semiconductor wafer, flat panel display substrate, etc. The process gas can be supplied to the interior of the vacuum chamber by a gas distribution system such as a showerhead, a gas distribution ring, gas injectors, etc. Reactors having plural gas distribution systems are disclosed in U.S. Pat. Nos. 5,134,965; 5,415,728; 5,522,934; 5,614,055; 5,772,771; 6,013,155; and 6,042,687.

In the case of etching, plasma etching is conventionally used to etch metal, dielectric and semiconducting materials. A plasma etch reactor typically includes a pedestal supporting the silicon wafer on a bottom electrode, an energy source which energizes process gas into a plasma state, and a process gas source supplying process gas to the chamber.

A common requirement in integrated circuit fabrication is the etching of openings such as contacts and vias in dielectric materials. The dielectric materials include doped silicon oxide such as fluorinated silicon oxide (FSG), undoped silicon oxide such as silicon dioxide, silicate glasses such as boron phosphate silicate glass (BPSG) and phosphate silicate glass (PSG), doped or undoped thermally grown silicon oxide, doped or undoped TEOS deposited silicon oxide, etc. The dielectric dopants include boron, phosphorus and/or arsenic. The dielectric can overlie a conductive or semiconductive layer such as polycrystalline silicon, metals such as aluminum, copper, titanium, tungsten, molybdenum or alloys thereof, nitrides such as titanium nitride, metal silicides such as titanium silicide, cobalt silicide, tungsten silicide, molybdenum silicide, etc. A plasma etching technique, wherein a parallel plate plasma reactor is used for etching openings in silicon oxide, is disclosed in U.S. Pat. No. 5,013,398.

U.S. Pat. No. 5,736,457 describes single and dual "damascene" metallization processes. In the "single damascene" approach, vias and conductors are formed in separate steps wherein a metallization pattern for either conductors or vias is etched into a dielectric layer, a metal layer is filled into the etched grooves or via holes in the dielectric layer, and the excess metal is removed by chemical mechanical planarization (CMP) or by an etch back process. In the "dual damascene" approach, the metallization patterns for the vias and conductors are etched in a dielectric layer and the etched grooves and via openings are filled with metal in a single metal filling and excess metal removal process.

It is desirable to evenly distribute the plasma over the surface of the wafer in order to obtain uniform etching rates over the entire surface of the wafer. Current gas distribution chamber designs include multiple supply lines and multiple mass flow controllers (MFCs) feeding separate regions in the chamber. However, the current gas distribution designs require numerous components, complexity in design and high cost. It therefore would be desirable to reduce the complexity and cost to manufacture such gas distribution arrangements.

SUMMARY OF THE INVENTION

The present invention provides a gas distribution system useful for a reaction chamber used in semiconductor substrate processing, comprising a plurality of gas supplies, a mixing manifold wherein gas from the plurality of gas supplies is mixed together, a plurality of gas supply lines delivering the mixed gas to different zones in the chamber, the gas supply lines including a first gas supply line delivering the mixed gas to a first zone in the chamber and a second gas supply line delivering the mixed gas to a second zone in the chamber, at least one control valve controlling a rate of flow of the mixed gas in the first and/or second gas supply line such that a desired ratio of flow rates of the mixed gas is achieved in the first and second gas supply lines, at least one flow measurement device measuring flow rate of the mixed gas in the first and/or second gas supply line, and a controller operating the at least one control valve in response to the flow rate measured by the at least one flow measurement device.

According to a preferred embodiment, the controller comprises a computer or programmable logic device which operates the at least one control valve such that a proportion of mixed gas delivered to at least one of the plurality of gas supply lines is changed from a first setpoint to a second setpoint during processing of a semiconductor substrate in the chamber. In one embodiment, the at least one control valve comprises first and second control valves and the at least one flow measurement device comprises first and second flow measurement devices, the first control valve and the first measurement device being located along the first gas supply line and the second control valve and the second flow measurement device being located along the second gas supply line. In another embodiment, the at least one control valve comprises a single control valve and the at least one flow measurement device comprises a single flow measurement device located along either the first or second gas supply line. The reaction chamber can comprise a vacuum chamber such as a plasma etch chamber or a CVD chamber.

The invention also provides a method of processing a substrate in the reaction chamber, the process comprising supplying a semiconductor substrate to the reaction chamber, measuring flow rate of mixed gas in the first and/or second gas supply line with at least one flow measurement device, and processing the substrate by supplying the mixed gas to the first and second zones, the at least one control valve being adjusted by the controller in response to the flow rate measured by the at least one flow measurement device. In a preferred embodiment, the controller monitors total gas flow supplied by the gas supplies to the mixing manifold and compares the total gas flow and the measured gas flow in one of the gas supply lines to a target flow for the second gas supply line, the at least one control valve being repeatedly adjusted by the controller to achieve the desired ratio of flow rates in the first and second gas supply lines. The semiconductor substrate can comprise a silicon wafer which is processed by depositing a layer of material on the wafer or plasma etching a dielectric, semiconductive or conductive layer of material on the wafer.

BRIEF DESCRIPTION OF THE DRAWINGS

The objects and advantages of the invention will be understood by reading the following detailed description in conjunction with the drawings in which.

DETAILED DESCRIPTION OF THE PREFERRED EMBODIMENTS

Figure 1:
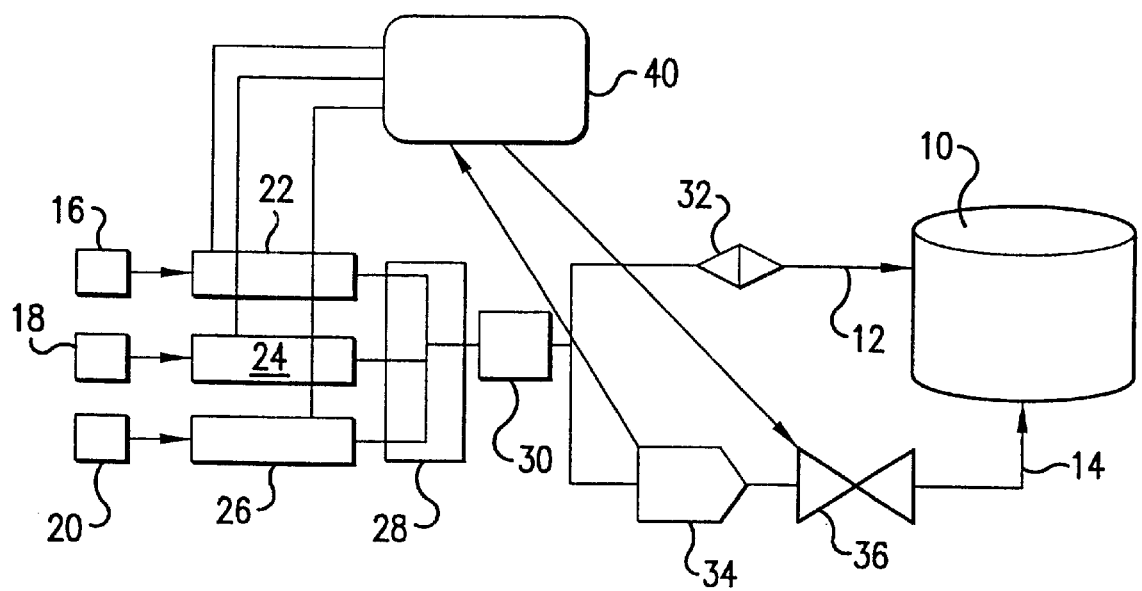
FIG. 1 illustrates a gas distribution arrangement according to a first embodiment of the present invention.

For a better understanding of the invention, the following detailed description refers to the accompanying drawings, wherein preferred exemplary embodiments of the present invention are illustrated and described. In addition, the reference numbers used to identify like elements in the drawings are the same throughout.

According to the present invention, a gas supply arrangement supplies a mixed process gas in desired proportions to a plurality of zones in a processing chamber. The gas supply arrangement can be used in any type of semiconductor processing apparatus wherein it is desired to selectively distribute process gas over a semiconductor substrate. Such apparatus includes CVD systems, ashers, capacitive coupled plasma reactors, inductive coupled plasma reactors, ECR reactors, and the like.

According to a first embodiment of the invention, a mixed process gas is delivered via a gas distribution system to multiple zones within a semiconductor processing chamber such as a reaction plasma etch chamber or other vacuum processing reactor, while simultaneously feedback controlling the fraction of process gas delivered to each zone, based upon a given setpoint and at least one flow rate reading. In etching silicon dioxide, aluminum, or polysilicon films on a semiconductor wafer, it is generally desirable to supply the mixed process gas in controlled proportions to both the region near the center and the perimeter (edge) of the wafer. The optimal spatial distribution of the gas feed helps achieve uniform etch results across the entire wafer, although the desired proportions may depend upon the application. For example, it may be beneficial to feed, say, 75% of the process gas to the edge and, say, 25% of the process gas to the center of the wafer for a given application. In a different etch application which may be performed on the same tool, it might be advantageous to feed, say, 10% of the process gas to the edge and, say, 90% to the center of the wafer. Furthermore, it may be desirable to change the proportion of process gas delivered to the two zones from step-to-step in a complex multistep etch recipe. In prior art arrangements, a fixed spatial distribution of gas feed (e.g., a showerhead with a specific hole pattern) was typically chosen based upon a tradeoff of the applications of interest and the etch uniformity requirements.

The gas distribution system of the invention can provide the capability of controlling in real time the fraction of process feed gas which is delivered to multiple zones within the processing chamber, to tailor the neutral gas composition within the processing chamber and thereby to assist in achieving uniform processing (e.g., etching) results across the entire wafer. This is a particularly useful feature for advanced semiconductor processing equipment, where larger diameter wafers are being used in integrated circuit manufacturing, and the feature sizes on the devices continue to shrink.

The gas distribution system of the invention can be implemented in a vacuum chamber which is supplied process gas by feed gas supply lines, pressure regulators, mass flow controllers (MFCs), various shutoff valves and associated plumbing, and a mixing manifold. A gas supply arrangement according to the invention can be physically located between a mixing manifold and the vacuum processing (etch or CVD) chamber and serves to split the mixed gas flow into multiple lines for delivery to multiple zones of the chamber. The flow delivered to the chamber from the gas box is preferably controlled by a computer, typically the same computer used to control processing parameters/operation of the chamber. In operation, a user can set the gas distribution system to flow one or more gases at specific flow rates to feed a mixed process gas to the reactor for etching the wafer. For example, in an aluminum etch application, the user might flow a mixture of $Cl_2$, $BCl_3$, and $N_2$ at flow rates of 100, 200, and 4 sccm, respectively, during the main etch step. The flow rates of the process gas components can be controlled and monitored by MFCs.

In one implementation, the invention can include at least one flow measurement device, one flow control device, and a feedback control system for controlling the proportion of mixed gas flow delivered to at least two zones within the chamber. The feedback control system could include analog electrical circuitry and/or a digital control algorithm executing on a programmable logic device or computer.

FIG. 1 shows a schematic of a first embodiment of a gas distribution system in accordance with the invention wherein a processing chamber 10 is supplied processing gas through gas supply line 12 (which can provide process gas to a showerhead or other gas supply arrangement arranged in the upper portion of the chamber) and a gas supply line 14 (which supplies processing gas to a lower portion of the chamber such as, for example, to a gas distribution ring surrounding the substrate holder or through gas outlets arranged in the substrate support). However, an alternative dual gas feed arrangement can supply gas to the top center and top perimeter of the chamber. Processing gas is supplied to the gas lines 12, 14 from gas supplies 16, 18, 20, the process gasses from supplies 16, 18, 20 being supplied to mass flow controllers 22, 24, 26, respectively. The mass flow controllers 22, 24, 26 supply the process gasses to a mixing manifold 28 after which the mixed gas passes through an optional flow meter 30 which in turn directs the mixed process gas to the flow lines 12, 14. Flow line 12 can include an optional flow restricting device 32 and flow line 14 can include a flow measurement device 34 and a feedback control valve 36. A control system 40 monitors the flow measurement device 34 and is effective to control the mass flow controllers 22, 24, 26 as well as the feedback control valve 36. This feedback control system allows adjustment of the proportion of mixed gas delivered to two zones of the processing chamber. The optional flow restricting device 32 can be a fixed orifice or needle valve or the like.

In operation, the user would select setpoints for the flows of each feed gas within the gas box, and would select the fraction of mixed flow to be delivered to each region of the processing chamber. For example, the user might select a flow of 100 $Cl_2$/200 $BCl_3$/4 sccm $O_2$ with 75% delivered through line 12 and 25% through line 14. The fraction of mixed flow in the respective delivery lines is controlled by repeated adjustment of the feedback control valve in line 14 based upon the actual flow measured in line 14 with respect to its target flow. By comparing the total flow, which in this case could be measured by summing all of the flow readouts of the mass flow controllers 22, 24, 26 in the gas box, with the flow measured by the meter in the chamber delivery line 12, the controller can adjust the degree of throttling in the valve 36 in line 14 to achieve the desired flow distribution. Alternatively, an optional total flow meter could be installed just downstream of the mixing manifold 28 to measure the total flow of mixed gas, rather than determining the total flow by summing the readouts of the MFCs 22, 24, 26 in the gas box.

In the case where the total flow is determined by summing the gas box MFC readouts, these measured flow rates can be converted to equivalent standard cubic centimeters per minute (sccms) of a reference gas, such as nitrogen, to provide accurate and flexible control in the general case where the gas mixture may differ from process to process. Hence, a calculation could be performed to convert mixed gas flow to a "nitrogen equivalent flow" and the in-line flow measurement device in line 14 could be calibrated to measure "nitrogen equivalent flow" to put all flow measurements on the same basis. As an example, in a typical thermal-based mass flow meter 100 sccm of $Cl_2$ is equivalent to 116.5 sccm of nitrogen, 200 sccm of $BCl_3$ is equivalent to 444.4 sccm of nitrogen, and 4 sccm of $O_2$ is equivalent to 4.08 sccm of nitrogen. Hence, the "nitrogen equivalent flow" of the mixed gas in the example above is 564.98 sccm and to deliver 25% through the line with the feedback controlled valve, the control loop could adjust the valve to achieve a flow reading of 0.25*564.98=141.2 sccm of nitrogen for this example. Note that at steady state, the entire flow of mixed gas from the gas box will ultimately reach the chamber, because the optional flow restrictor in line 12 is not being adjusted during the process, and the pressure will naturally build in the mixing manifold until the total in flow equals the total out flow.

Figure 2:
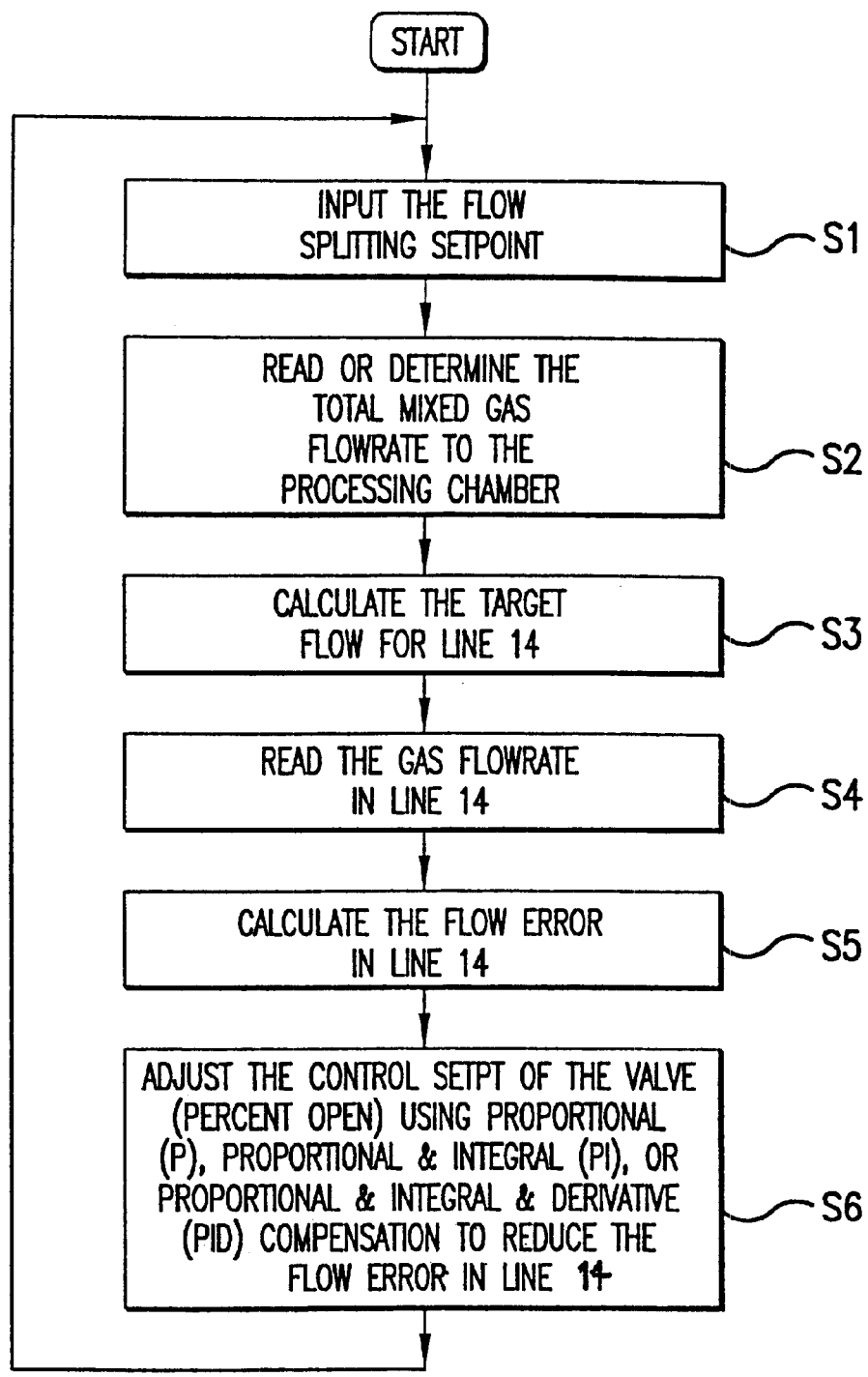
FIG. 2 is a flow diagram of a process of controlling gas distribution in a reaction chamber according to the first embodiment of the present invention.

FIG. 2 shows a flowchart summarizing the method for controlling the split gas feed using the apparatus of FIG. 1. This procedure could be executed repeatedly at a rate of, say, 1–500 Hz (e.g., 50 Hz) during a given process run in order to adjust to changes in recipe conditions and flows on a real time basis. As shown in FIG. 2, the flowchart illustrates steps wherein S1 is a step of inputting the flow splitting set point such as the percent flow rate to be supplied to a particular portion of the processing chamber, S2 is a step of reading or determining the total mixed gas flow rate supplied to the processing chamber, S3 illustrates the step of calculating the target flow for line 14 based upon the flow split setpoint and the total flow rate, S4 illustrates the step of reading the gas flow rate in line 14, S5 illustrates the step of calculating the flow error in line 14 which is defined as the difference between the target and actual flow rates in line 14, and S6 illustrates the step of adjusting the control setpoint of the valve (e.g., percent open) using proportional (P), proportional and integral (PI) or proportional and integral and derivative (PID) compensation to reduce the flow error in line 14.

Figure 3:
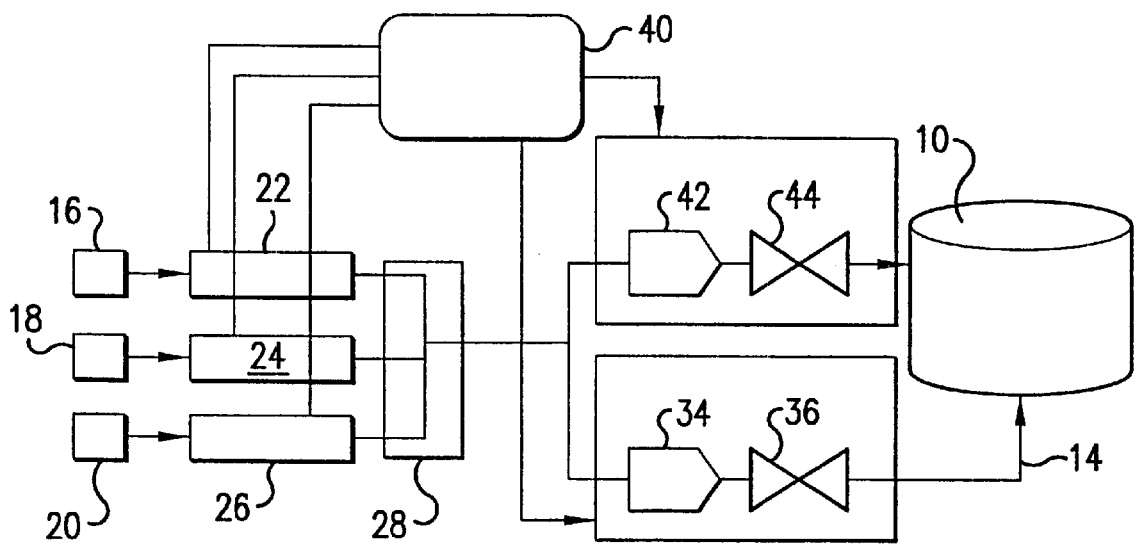
FIG. 3 illustrates a gas distribution arrangement according to a second embodiment of the present invention.

FIG. 3 illustrates a second and most preferred embodiment of a gas flow arrangement according to the invention, where the optional flow restrictor in line 12 is replaced with a combination of a flow meter 42 and a feedback controlled throttling valve 44, i.e., an implementation where the process feed gas is split using two throttling valves and two flow meters. The open aperture of one or both of the throttle valves can be adjusted based upon a comparison of the user selected flow-splitting and the flow meter readings. Conveniently, the combination of the flow meter and throttling valve (enclosed by the dotted box) could be implemented using a conventional mass flow controller, where the control system sends separate flow setpoint controls to each leg to achieve the user's selected flow splitting. This implementation provides slightly more flexibility than that of FIG. 1, owing to the ability to actively adjust and control the conductance of each gas delivery line. This allows, for example, the ability to adjust the flow splitting from say 0–100% in either line. In contrast, the implementation of FIG. 1 may not allow 100% flow to be delivered through line 14 without some (manual) adjustment to the optional flow restrictor 32. Furthermore, the implementation in FIG. 3 provides a real time measurement of the flow in each mixed gas delivery line which allows real time fault detection (e.g., detecting a flow blockage in a given line or a drift in a gas box MFC calibration) while processing wafers in production. During operation, the open aperture of one or both of the throttle valves is adjusted based upon a comparison of the user selected flow-splitting setpoint and actual flow splitting fraction determined by from the ratio of the measured flow in either line 12 or 14 to the total flow (measured by summing the respective flow meter readings in lines 12 and 14). Conveniently, the combination of flow meter and throttling valve (enclosed by the dotted box) in either or both of lines 12 and 14 could be implemented using a conventional mass flow controller, where the control system sends separate flow setpoint controls to each MFC in lines 12 and 14 to achieve the user selected flow splitting.

In the case where conventional MFCs are used in lines 12 and 14, in general, it is preferred that one MFC be commanded full open while the other MFC is actively controlled by a control circuit or algorithm executing on a microprocessor (or equivalent) to achieve the user selected flow splitting. This ensures that the total mixed flow equals the total mixed flow out and, hence, there is no unnecessary or excess storage of gas upstream of the MFCs in lines 12 and 14, which could affect the ultimate process results within the chamber. In addition, this eliminates the possibility of these MFCs actively competing with one another for the available supply of gas, which could lead to control instabilities. Assuming the MFCs in lines 12 and 14 were identical (e.g., same flow calibration and capacity, same pressure drop, etc.) and MFC on the line with the largest requested setpoint would normally be controlled to the full open condition, while the MFC on the other line would be actively controlled based on the setpoints and respective flow readings, to achieve the lower flow in that line. This can be explained as follows. If the MFCs were identical and were both controlled to the full open position, then the fraction of flow in each line would be 50%. In order to achieve more than 50% in, say, line 12, the flow conductance of the line 14 must be reduced (by partially closing the line 14 throttling valve). This action would cause a slight increase in the mixing manifold pressure, which would cause an increase in the flow through line 12, because the flow in a given line is proportional to the pressure drop in that line. For descriptive purposes, the MFC controlled to the full open position is referred to as the "master" MFC and the MFC actively controlled is referred to as the "slave" MFC.

In practice, it is unusual for two MFCs to have identical pressure drops across them because of manufacturing tolerances, even though the flow control and calibrations may be identical. In fact, in some situations it may be useful to use different MFC ranges to achieve the desired control performance. For example, one might use a combination of a 1000 sccm and a 250 sccm MFCs in order to provide 4 time better flow control accuracy at low flows (e.g., less than 100 sccm) in the line with the 250 sccm MFC. The improved resolution in the line with the lower range MFC is achieved because MFCs typically only accurately control flow down to a few percent of full scale range. (The internal PID tuning of the MFCs will compensate for these differences). Hence, the selection of which MFC is master and which MFC is slave for a given flow splitting setpoint would generally be determined based upon a calibration experiment which measures the natural flow splitting of the particular MFCs in use with both MFCs controlled to the full open position. Furthermore, this natural flow splitting can be a function of the type of gas being flowed in addition to the relative ranges of the MFCs being used (for example, 1000 and 250 sccm MFCs vs 1000 and 1000 MFCs) as well as the flow rate, so it may be necessary to use a look up table to select the appropriate master and slave MFC for a given condition. In addition, the control algorithm could include a check in the control loop to assess whether the correct master (fully open) MFC was selected and adjust the master selection as needed based upon user selected flow splitting tolerances, etc.

Figure 4:
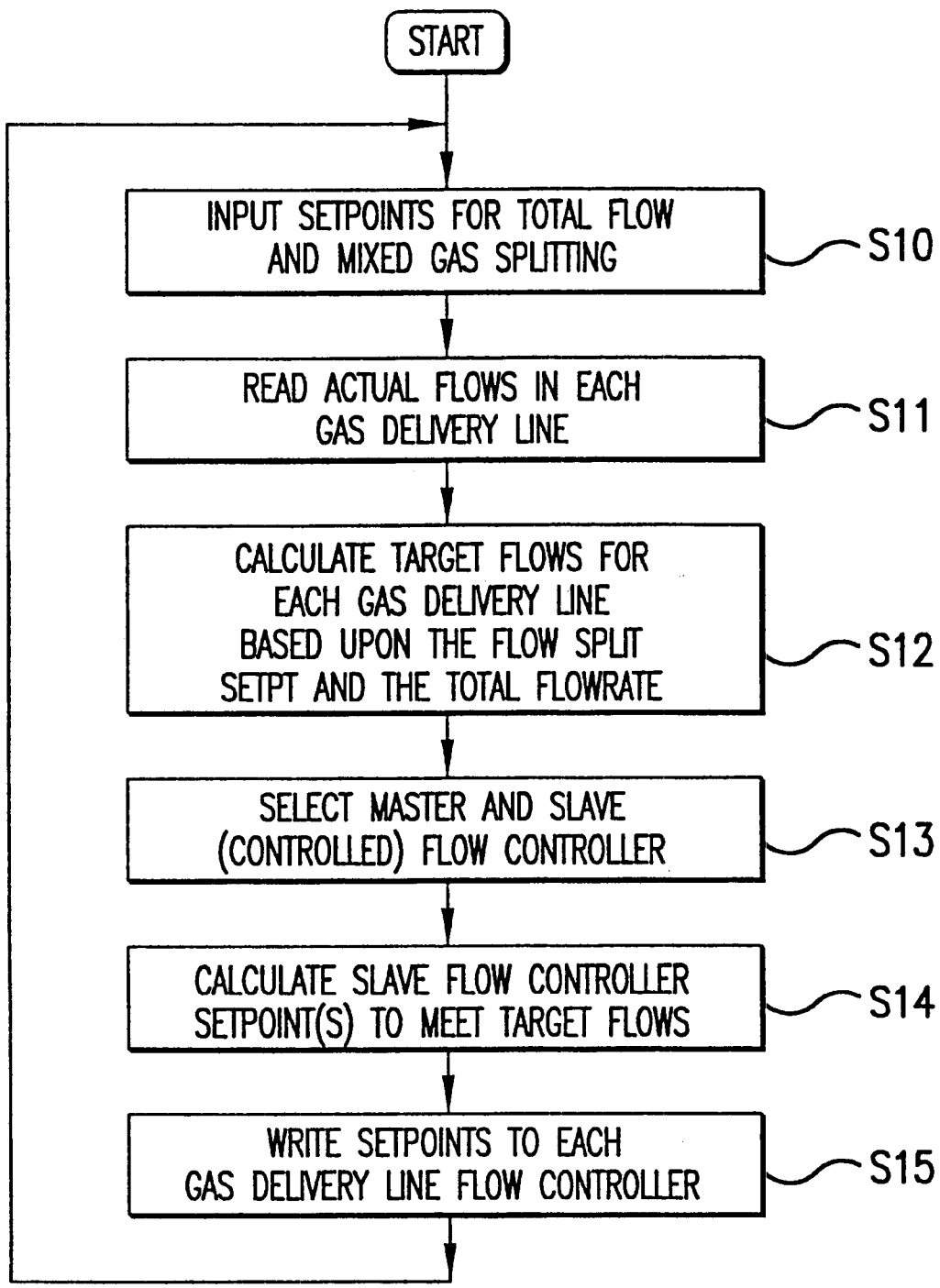
FIG. 4 is a flow diagram of a process of controlling gas distribution in a reaction chamber according to the second embodiment of the present invention.

The overall control algorithm (less the master/slave checking feature) for this implementation is summarized in the flowchart shown in FIG. 4 which shows a flowchart of the basic functions performed for independently controlling the flow to at least two different regions of the processing chamber wherein step S10 is a step of inputting setpoints for total flow mixed gas splitting, S11 is a step of reading actual flows in each gas delivery line (such as at the center and edge of a wafer being processed) and determining the total flow, S12 is a step of calculating target flows for each gas delivery line based upon the flow split setpoint and the total flow rate, S13 is a step of selecting the master and slave (controlled) flow controller, S14 is a step of calculating the slave flow controller setpoint(s) to meet target flows (this step may act to accelerate reaching the target flows by calculating the current flow split error and implementing PID compensation into the calculation of the new setpoints), and S15 is a step of writing setpoints to each gas delivery line flow controller (such as at the center and edge of the wafer being processed). The response time of the split feed control can be further improved by adding PID compensation to the calculated target flow of the slave MFC. For example, adding proportional compensation to the new slave setpoint could be achieved by calculating the new setpoint from the following equation:

New Slave MFCX Flow Setpoint=Slave MFC Target Flow+Proportional Gain*(Slave MFC Target Flow−Slave MFC Actual Flow).

Figure 5:
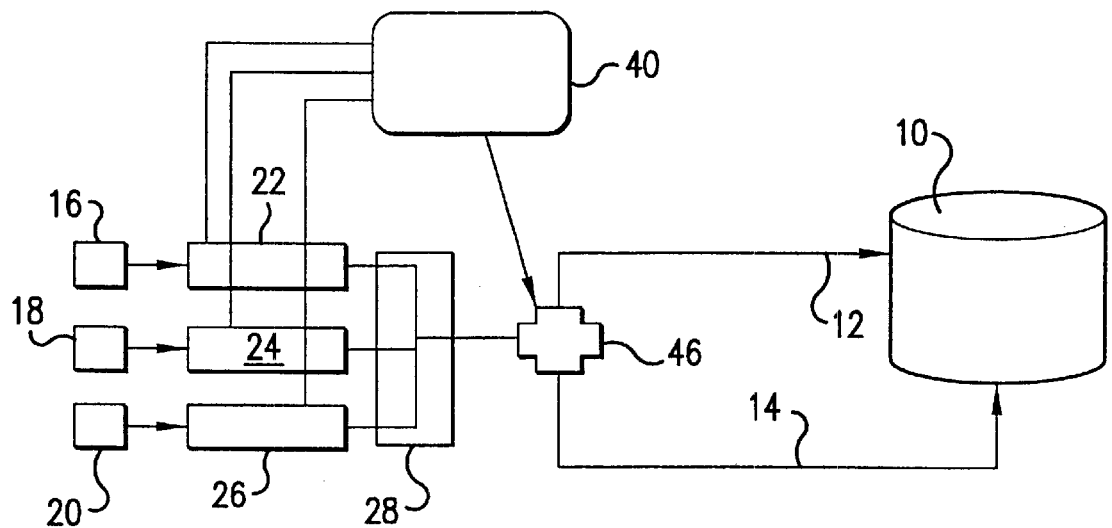
FIG. 5 illustrates a gas distribution arrangement according to a third embodiment of the present invention.

FIG. 5 shows another distinct implementation of the present invention, where the process feed gas is split using a one-input-two-output throttling valve 46, where a control setpoint selects the fraction of flow exhausting from each leg based upon a predetermined valve calibration. One limitation of this implementation is that the calibration of the valve splitting fraction is gas composition and flow dependent. Without flow meters to monitor the relative flow in each delivery channel, the accuracy of the flow splitting for a given gas mixture at a given flow may vary for different processing conditions. The lack of in-line flow meters also prevents fault detection of situations such as flow blockages or calibration drift which could lead to process drift on wafer processing results. Another drawback of this implementation is the current lack of commercially available one-input-two-output throttling valves compared to widespread availability of commercial mass flow meters, flow control valves, and mass flow controllers.

Figure 6:
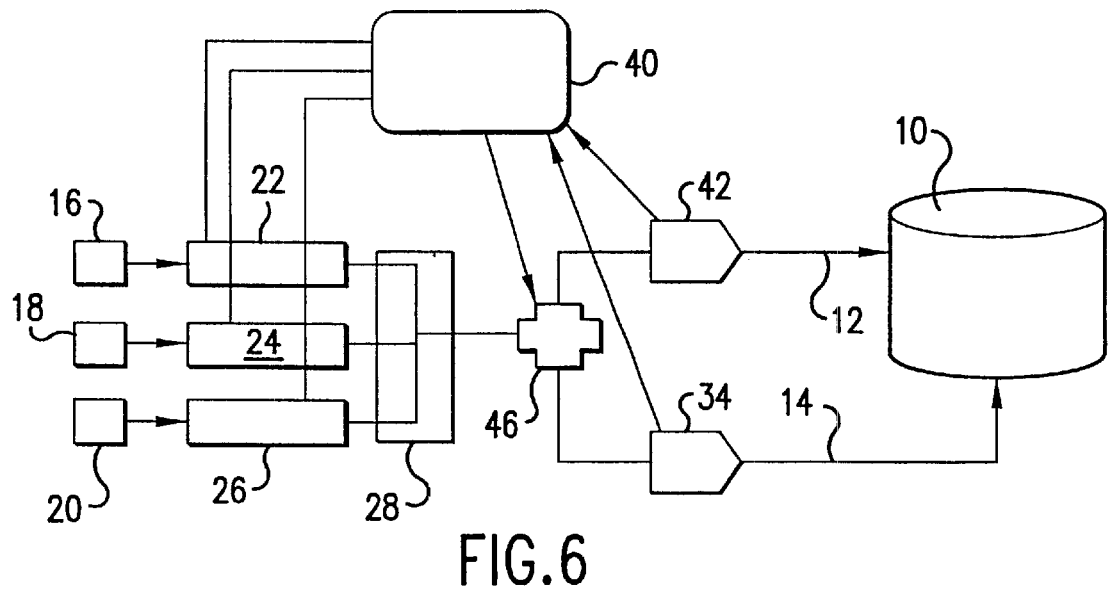
FIG. 6 illustrates a gas distribution arrangement according to a fourth embodiment of the present invention.

FIG. 6 shows an augmentation of the implementation of that in FIG. 5 by providing at least one flow meter 42, 34 in the gas delivery line(s) to allow feedback control of the splitter valve as well as the fault detection capabilities. If only one flow meter is used in FIG. 6, the total flow measurement would be determined by summing the flow readings of the MFCs within the gas box. If two flow meters are implemented, then the total flow can be determined by summing the flow measured by the meters in lines 12 and 14.

Figure 7A:
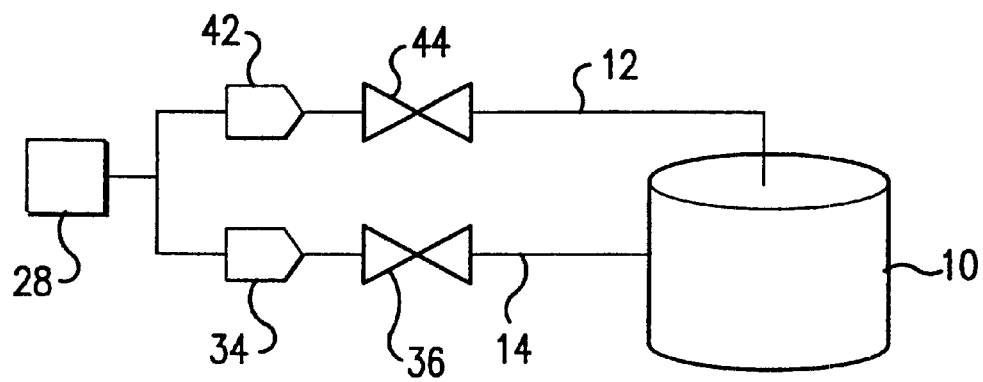
FIG. 7A illustrates a gas distribution arrangement according to a fifth embodiment of the present invention.

FIG. 7A shows a gas injection arrangement according to a fifth embodiment of the invention wherein gas from a gas manifold 28 is split to supply a top gas feed line 12 and a perimeter gas feed line 14, each of which includes a flow meter 42, 34 and a feedback controlled throttling valve 44, 36. In the embodiment shown, the top gas feed could be provided in the center of the dielectric window of the chamber shown in U.S. Pat. No. 4,948,458 (the disclosure of which is hereby incorporated by reference) and the perimeter gas feed could be provided to the gas ring beneath the window.

Figure 7B:
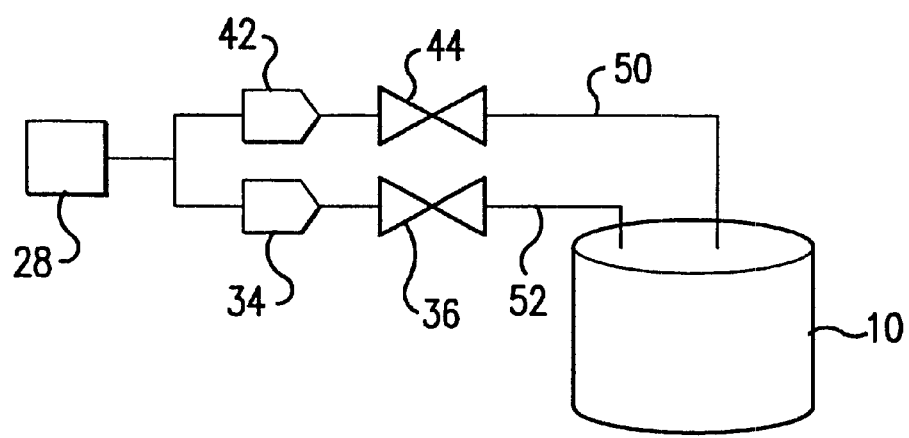
FIG. 7B illustrates a gas distribution arrangement according to a sixth embodiment of the present invention.

FIG. 7B shows a gas injection system according to a sixth embodiment of the invention wherein gas feeds supply a two zone showerhead, an example of which is described in commonly owned U.S. application Ser. No. 09/343,690 (P510), the disclosure of which is hereby incorporated by reference. As shown, the gas injection system supplies gas from a gas manifold 28 to a center plenum via gas feed line 50 and an annular outer plenum via gas feed line 52 arranged outwardly of the center plenum 50. The center plenum can have various configurations such as a circular plenum or an annular plenum of smaller diameter than the outer plenum.

Figure 8:
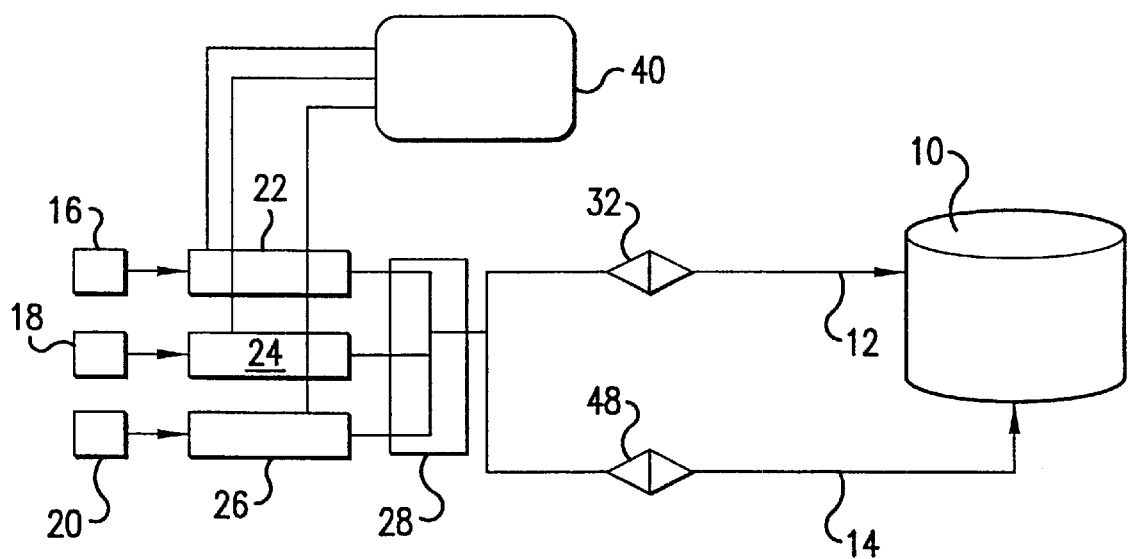
FIG. 8 illustrates a gas distribution arrangement wherein fixed orifices are used to split gas feed to locations in a plasma reaction chamber.

FIG. 8 shows an arrangement wherein one or more fixed orifices or flow apertures downstream of a mixing manifold are used to split gas feed to a plurality of locations in a processing chamber. The FIG. 8 arrangement has been implemented in a flat panel display etching tool where center and edge gas injection was used. The center gas feed line had a fixed orifice inserted within the line feeding a single center gas feed injector while the edge feed line had no fixed orifice but rather fed a plurality of edge injectors. The purpose of the fixed orifice in the center injector is to limit the supply of gas to the center of the chamber. That is, without the fixed orifice, the proportion of flow to the center of the chamber would be larger than desired.

The gas distribution system according to the invention can be used in high density plasma reactors. Such plasma reactors typically have high energy sources which use RF energy, microwave energy, magnetic fields, etc. to produce the high density plasma. For instance, the high density plasma could be produced in a transformer coupled plasma (TCP™) which is also called inductively coupled plasma reactor, an electron-cyclotron resonance (ECR) plasma reactor, a helicon plasma reactor, or the like. An example of a high flow plasma reactor which can provide a high density plasma is disclosed in commonly owned U.S. Pat. No. 5,820,723, the disclosure of which is hereby incorporated by reference.

The gas distribution system according to the invention can be used for plasma etching processes wherein process gas supplied by the first and second gas supplies in the foregoing embodiments can be changed relative to each other, e.g., during etching of a trench, for example, a mixture of Ar, oxygen and fluorocarbons (e.g., $CHF_3$ and $C_4F_8$) can be supplied and during etching of vias the flow of the oxygen to the central region of a wafer can be decreased by reducing the flow rate of the mixed gas supplied to the central region. In the case of etching low-k dielectric layers, the process gas can include a hydrocarbon such as $C_2H_4$ and the ratio of the hydrocarbon/oxygen gas flow rate in the central and peripheral regions of the wafer can be varied radially to achieve uniform etching. Thus, according to the invention the amount of mixed gas supplied to the center and edge of the wafer can be adjusted to compensate for edge fast etching and center fast etching conditions in the plasma chamber. For example, in a conventional plasma etcher, edge fast etch conditions can occur until the photoresist is eroded after which center fast etch conditions can occur. With the gas distribution apparatus according to the invention, more oxygen can be supplied in the center when the wafer has a photoresist layer whereas when the photoresist layer is eroded away, the flow of oxygen to the center can be reduced. As a result, more uniform etching can be achieved by compensating for the edge-fast and center-fast etch conditions.

The present invention has been described with reference to preferred embodiments. However, it will be readily apparent to those skilled in the art that it is possible to embody the invention in specific forms other than as described above without departing from the spirit of the invention. The preferred embodiment is illustrative and should not be considered restrictive in any way. The scope of the invention is given by the appended claims, rather than the preceding description, and all variations and equivalents which fall within the range of the claims are intended to be embraced therein.

What is claimed is:

1. A gas distribution system useful for a reaction chamber used in semiconductor substrate processing, comprising:
   a plurality of gas supplies;
   a mixing manifold wherein gas from the plurality of gas supplies is mixed together;
   a plurality of gas supply lines delivering the mixed gas to different zones in the chamber, the gas supply lines including a first gas supply line delivering the mixed gas to a first zone in the chamber and a second gas supply line delivering the mixed gas to a second zone in the chamber;
   at least one control valve controlling a rate of flow of the mixed gas in the first and/or second gas supply line such that a desired ratio of flow rates of the mixed gas is achieved in the first and second gas supply lines;
   at least one flow measurement device measuring flow rate of the mixed gas in the first and/or second gas supply line; and
   a controller operating the at least one control valve in response to the flow rate measured by the at least one flow measurement device.

2. The gas distribution system of claim 1, wherein the controller comprises a computer or programmable logic device which operates the at least one control valve such that a proportion of the mixed gas delivered to at least one of the plurality of gas supply lines is changed from a first setpoint to a second setpoint during processing of a semiconductor substrate in the chamber.

3. The gas distribution system of claim 1, wherein the control valve and flow measurement device are located along the first gas supply line.

4. The gas distribution system of claim 1, wherein the at least one control valve comprises first and second control valves and the at least one flow measurement device comprises first and second flow measurement devices, the first control valve and the first measurement device are located along the first gas supply line and the second control valve and the second flow measurement device are located along the second gas supply line.

5. The gas distribution system of claim 1, wherein the at least one control valve and the at least one flow measurement device comprise a single control valve and a single flow measurement device located along the first gas supply line, the apparatus further including a flow restricting device located along the second gas supply line.

6. The gas distribution system of claim 1, wherein the control valve comprises a variable splitter valve operable to deliver a first proportion of the mixed gas to the first supply line and deliver a second proportion of the mixed gas to the second gas supply line.

7. The gas distribution system of claim 6, wherein the at least one flow measurement device comprises first and second flow measurement devices, the first flow measurement device measuring flow rate of the mixed gas in the first gas supply line, the second flow measurement device measuring flow rate of the mixed gas in the second gas supply line, and the controller operating the at least one control valve in response to the flow rates measured by the first and second flow measurement devices.

8. The gas distribution system of claim 1, wherein the at least one control valve comprises a first control valve located along the first gas supply line and a second control valve located along the second gas supply line, the controller operating the first control valve so as to be in a full open position and actively operating the second control valve to provide a lower flow rate in the second gas supply line than in the first gas supply line.

9. The gas distribution system of claim 1, wherein the at least one control valve comprises a first control valve located along the first gas supply line and a second control valve located along the second gas supply line, the controller operating the first control valve so as to be in a full open position and actively operating the second control valve to force more flow through the first gas supply line.

10. The gas distribution system of claim 1, further comprising mass flow controllers between the gas supplies and the mixing manifold, the mass flow controllers controlling flow rates of the gas supplies into the mixing manifold.

11. The gas distribution system of claim 1, wherein the chamber comprises a plasma etching chamber wherein RF energy is used to energize the mixed gas into a plasma state.

* * * * *